(12) United States Patent
Cheng et al.

(10) Patent No.: US 7,154,159 B2
(45) Date of Patent: Dec. 26, 2006

(54) TRENCH ISOLATION STRUCTURE AND METHOD OF FORMING THE SAME

(75) Inventors: Chien-Chang Cheng, Taoyuan (TW); Shing-Yih Shih, Taipei (TW); Chang-Rong Wu, Taipei (TW)

(73) Assignee: Nanya Technology Corporation, Taoyuon (TW)

( * ) Notice: Subject to any disclaimer, the term of this patent is extended or adjusted under 35 U.S.C. 154(b) by 39 days.

(21) Appl. No.: 10/784,203

(22) Filed: Feb. 24, 2004

(65) Prior Publication Data

US 2005/0184356 A1  Aug. 25, 2005

(51) Int. Cl.
  *H01L 29/00* (2006.01)
(52) U.S. Cl. .............................. 257/520; 257/E21.545; 257/E21.572; 257/E21.55; 257/E21.564

(58) Field of Classification Search .................. None
See application file for complete search history.

(56) References Cited

U.S. PATENT DOCUMENTS

| 6,844,591 | B1 * | 1/2005 | Tran ............................ 257/330 |
| 2004/0180510 | A1 * | 9/2004 | Ranade et al. .............. 438/430 |

* cited by examiner

*Primary Examiner*—Leonardo Andujar
*Assistant Examiner*—Scott R Wilson
(74) *Attorney, Agent, or Firm*—Birch, Stewart, Kolasch & Birch, LLP

(57) ABSTRACT

A trench isolation structure and a method of forming a trench isolation structure are provided. The method includes providing a substrate having a trench. A polysilicon liner is formed in the trench. A dielectric layer, such as spin-on glass, is formed in the trench upon the polysilicon liner.

19 Claims, 3 Drawing Sheets

TRENCH ISOLATION STRUCTURE AND METHOD OF FORMING THE SAME

FIELD OF INVENTION

The present invention generally relates to an isolation structure and a method of forming the same, and more particularly, to a trench isolation structure and a method of forming the trench isolation structure having a polysilicon liner.

BACKGROUND OF THE INVENTION

Semiconductor devices typically include multiple individual components formed on or within a substrate. The way to prevent unwanted components or structures from cross talk or shorting becomes significantly important, since the integration circuit density is continuously increased. Therefore, isolation techniques are very critical for the purpose of electrically insulating various portions or structures of the semiconductor device from other portions of the device. A popular isolation technology used for sub-micron ultra-large scaled integrated (ULSI) technology is a technique known as "shallow trench isolation (STI)".

Conventional trench processes includes etching a substrate surface to a depth, and then refilling the trench with a deposited dielectric layer. The dielectric layer is then planarized to complete the trench isolation structure. However, as the feature size shrinks and the aspect ratio of the trench increases, the gap filling ability becomes an important factor in selecting the filled dielectric material. Comparing to conventional deposition processes, spin-on glass processes have the advantage of excellent gap filling ability in filling trenches. Therefore, the spin-on glass becomes one of selected dielectric materials to fill the trench. Generally, the spin-on glass is formed by spin-coating a dielectric material over the substrate. Then, the coated dielectric material is annealed. The spin-on glass is then etched back to form a recess. A dielectric layer is subsequently deposited in the recess upon the spin-on glass. However, after the high temperature annealing process, the crack issue is likely to occur due to poor adhesion between the trench sidewall surfaces and the spin-on glass. The cracks between the spin-on glass and the trench sidewalls will reduce the isolation capability and a breakdown of the trench isolation may occur.

Therefore, there is a need to provide a trench isolation structure and a method of forming a trench isolation structure with enhanced adhesion between the filled dielectric layer and the trench sidewalls.

SUMMARY OF THE INVENTION

One aspect of the present invention is to provide a method of forming a trench isolation structure which implements a polysilicon liner to enhance the adhesion between the spin-on glass and trench sidewalls.

Another aspect of the present invention is to provide a method of forming a trench isolation structure which implements an annealing step to convert a polysilicon liner into an oxide layer to prevent the crack issue when the trench is filled with the spin-on glass.

In one embodiment of the present invention, a method of forming a trench isolation structure includes providing a substrate having a trench etched therein. A polysilicon liner is formed in the trench. A dielectric layer, such as spin-on glass is formed in the trench upon the polysilicon liner.

The step of forming the dielectric layer includes coating a spin-on glass over the substrate. A chemical mechanical polishing is preformed on the spin-on glass, which is then annealed and etched back to form a recess. During the annealing step, the polysilicon liner is converted into an oxide layer. The method further includes forming a filled dielectric layer, such as high density plasma formed oxide layer, in the recess upon the spin-on glass.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and, the accompanying drawings, which are given by way of illustration only, and thus are not limitative of the present invention, and wherein.

DETAILED DESCRIPTION OF THE INVENTION

The present invention discloses a trench isolation structure and a method of forming the same, which implements a polysilicon liner to enhance the adhesion between trench sidewalls and spin-on glass to prevent the crack issue. FIGS. 1 to 6 illustrate preferred embodiments of the present invention.

Figure 1:
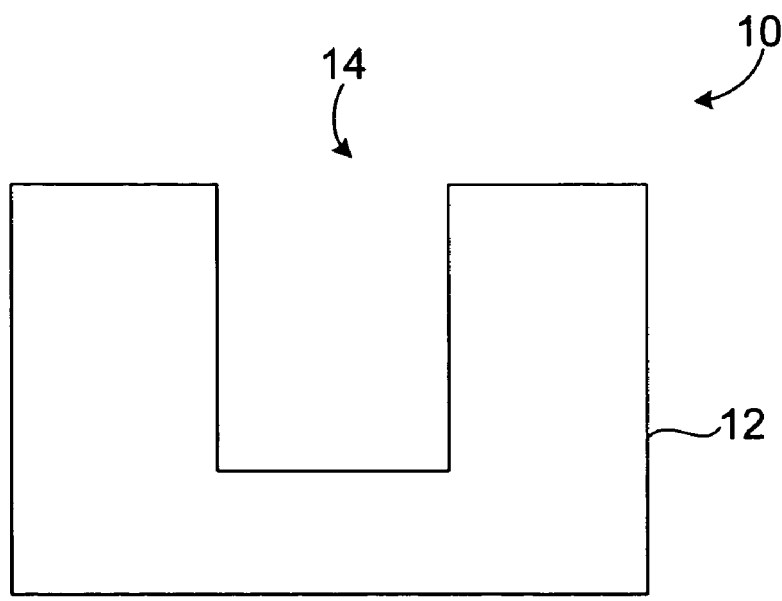
FIGS. 1 to 6 illustrate cross-sectional views of forming a trench isolation structure in one embodiment of the present invention.
Figure 2:
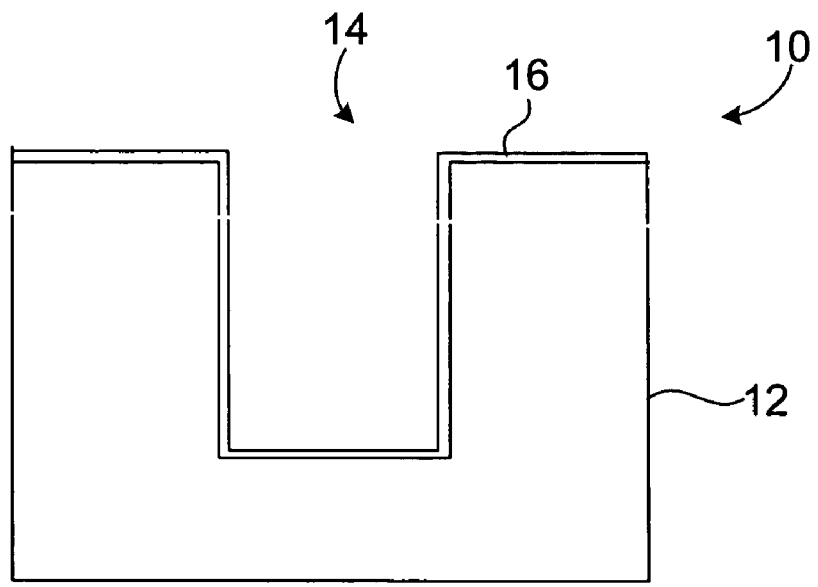

Referring to FIG. 1, in one embodiment, a method of forming a trench isolation structure 10 is provided. The method includes providing a substrate 12 having a trench 14. The substrate 12 can be a semiconductor substrate, such as a silicon wafer, a silicon-containing substrate, or any substrate in need of isolation structure as appropriate. The trench 14 can be formed by conventional processes, such as lithography, etch, etc. As shown in FIG. 2, a polysilicon liner 16 is formed in the trench 14. The polysilicon liner 16 can be formed by conventional deposition processes and preferably has a thickness of about 50–150 angstroms.

Figure 3:
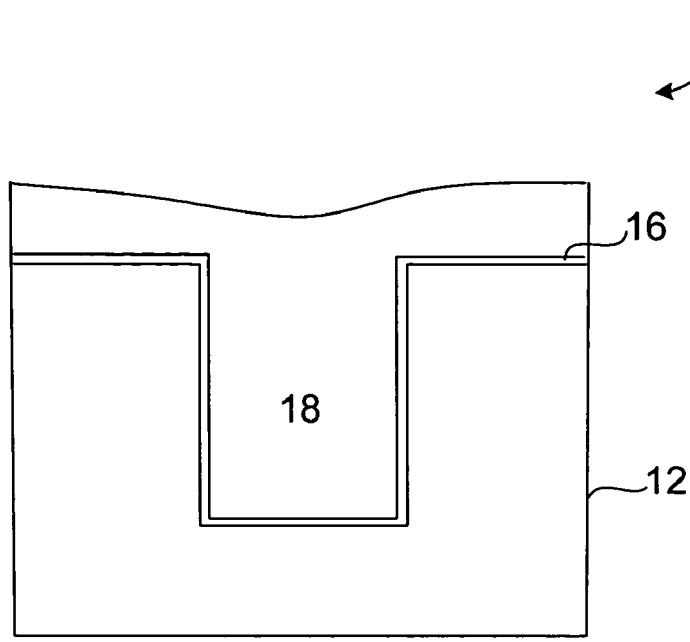
Figure 4:
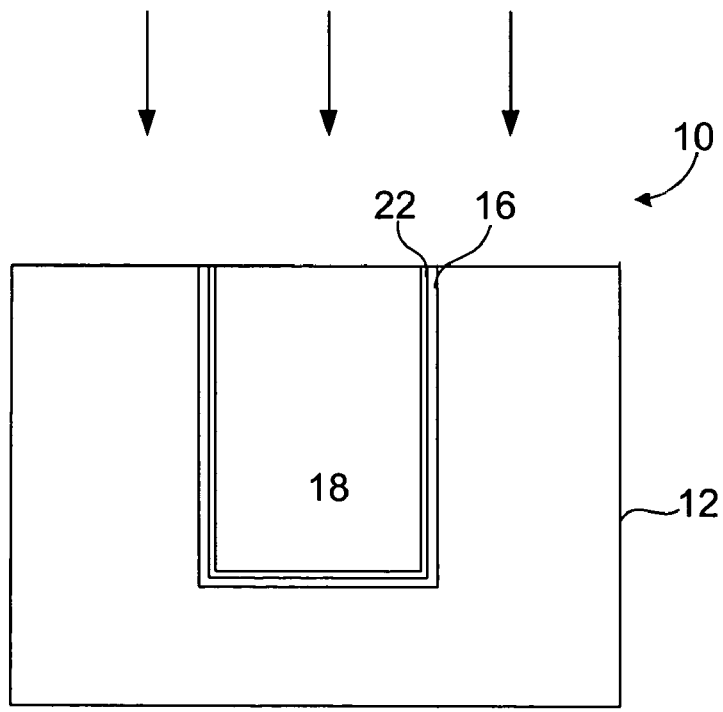

Referring to FIG. 3, a dielectric layer 18 is formed in the trench 14 upon the polysilicon liner 16. The dielectric layer 18 includes a spin-on glass. For example, the step of forming the dielectric layer 18 includes coating a spin-on glass over the substrate 12. A baking step is performed after the spin-on glass is coated. As shown in FIG. 4, the dielectric layer 18 is planarized to expose the substrate 12. In other words, a chemical mechanical polishing is performed on the spin-on glass 18 to expose the substrate 12. An annealing step is performed so as to convert the polysilicon liner 16 into an oxide layer 22. It is noted that the polysilicon liner 16 can be converted into the oxide layer 22, so as to enhance the adhesion between the spin-on glass and the trench sidewalls and prevent the crack issue.

Figure 5:
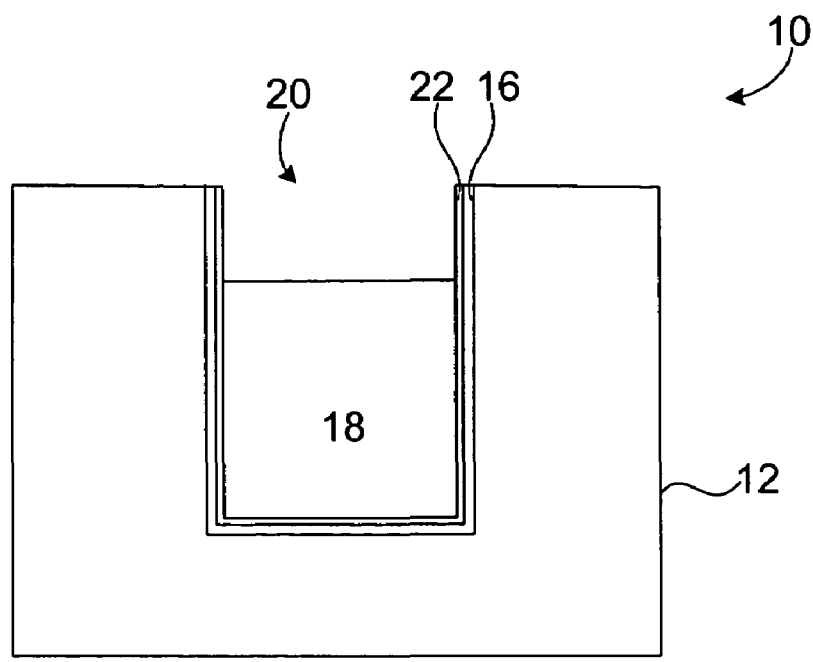

Referring to FIG. 5, the spin-on glass 18 is etched back to form a recess 20. For example, a wet etch process is performed on the spin-on glass 18 to create the recess 20 to a depth of about 500 to 1000 angstroms into the substrate 12.

Figure 6:
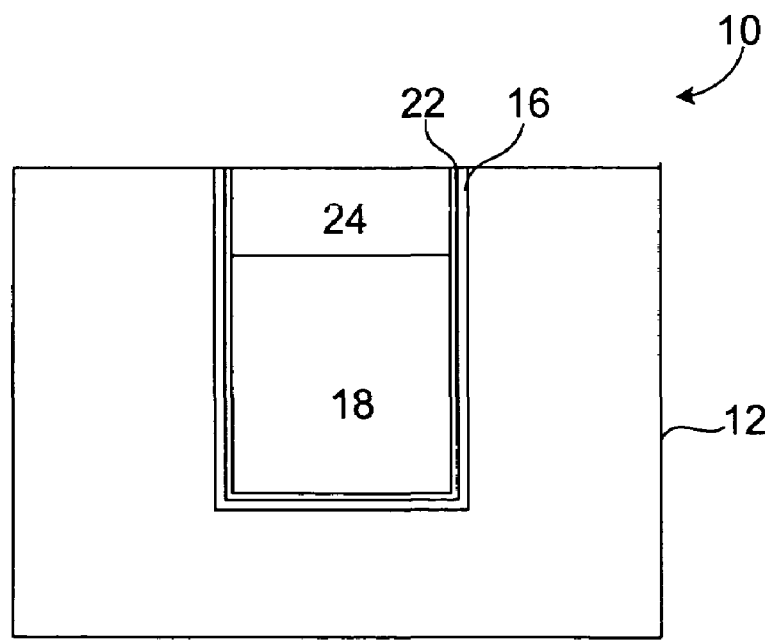

As shown in FIG. 6, a filled dielectric layer 24 is formed in the recess 20 upon the dielectric layer 18. The filled dielectric layer 24 can be formed by conventional processes, such as deposition, planarization, etc. For example, the filled dielectric layer 24 can be an oxide layer formed by high density plasma deposition processes, and then planarized by chemical mechanical polishing processes. Therefore, the trench isolation structure 10 with excellent adhesion between the spin-on glass and trench sidewalls is formed by implementing the polysilicon liner 16.

In another embodiment, a trench isolation structure 10 in a semiconductor substrate 12 is provided. As shown in FIG. 6, the trench isolation structure 10 includes a trench 14 formed in the semiconductor substrate 12, a polysilicon liner 16 arranged upon sidewall surfaces and a base surface of the trench 14, a spin-on glass arranged within the trench 14 upon the polysilicon liner 16, and a filled dielectric layer 24 arranged within the trench 14. The spin-on glass 18 is interposed between the polysilicon liner 16 and the filled dielectric layer 24. Furthermore, the trench isolation structure 10 includes an oxide layer 22, which is converted from the polysilicon liner 16. The filled dielectric layer 24 includes an oxide layer formed by high density plasma deposition processes.

Although specific embodiments have been illustrated and described, it will be obvious to those skilled in the art that various modifications may be made without departing from what is intended to be limited solely by the appended claims.

What is claimed is:

1. A method of forming a trench isolation structure, comprising:
   providing a substrate having a trench;
   forming a polysilicon liner in said trench; and
   forming a spin-on glass in said trench upon said polysilicon liner.

2. The method of claim 1, wherein said polysilicon liner has a thickness of about 50–150 angstroms.

3. The method of claim 1, wherein said step of forming said dielectric layer comprises:
   coating said spin-on glass over said substrate;
   performing a chemical mechanical polishing on said spin-on glass;
   annealing said spin-on glass; and
   etching back said spin-on glass to form a recess.

4. The method of claim 3, wherein said polysilicon liner is converted into an oxide layer during said annealing step.

5. The method of claim 3, further comprising a step of baking said spin-on glass after said coating step.

6. The method of claim 3, further comprising a step of forming a filled dielectric layer in said recess upon said spin-on glass.

7. The method of claim 6, wherein said filled dielectric layer comprises a high density plasma (HDP) oxide layer.

8. A method of forming a trench isolation structure, comprising:
   providing a substrate having a trench;
   forming a polysilicon liner in said trench;
   forming a spin-on glass in said trench upon said polysilicon liner; and
   annealing said spin-on glass.

9. The method of claim 8, wherein said polysilicon liner has a thickness of about 50–150 angstroms.

10. The method of claim 8, wherein said polysilicon liner is converted into an oxide layer during said annealing step.

11. The method of claim 8, wherein said step of forming said spin-on glass comprises:
    coating said spin-on glass over said substrate;
    baking said spin-on glass;
    performing a chemical mechanical polishing on said spin-on glass; and
    etching back said spin-on glass to form a recess.

12. The method of claim 11, further comprising a step of forming a filled dielectric layer in said recess upon said spin-on glass.

13. The method of claim 12, wherein said filled dielectric layer comprises a high density plasma oxide layer.

14. A method of forming a trench isolation structure, comprising:
    providing a substrate having a trench;
    forming a polysilicon liner in said trench;
    forming a dielectric layer in said trench upon said polysilicon liner; and
    baking said dielectric layer.

15. The method of claim 14, wherein said polysilicon liner has a thickness of about 50–150 angstroms.

16. The method of claim 14, further comprising steps of:
    performing a chemical mechanical polishing on said dielectric layer; and
    etching back said dielectric layer to form a recess.

17. The method of claim 16, further comprising a step of forming a filled dielectric layer in said recess upon said dielectric layer.

18. The method of claim 17, wherein said filled dielectric layer comprises a high density plasma oxide layer.

19. The method of claim 14, further comprising a step of annealing said polysilicon liner to be an oxide layer.

* * * * *